(12) United States Patent
Hu et al.

(10) Patent No.: US 6,451,679 B1
(45) Date of Patent: Sep. 17, 2002

(54) ION MIXING BETWEEN TWO-STEP TITANIUM DEPOSITION PROCESS FOR TITANIUM SALICIDE CMOS TECHNOLOGY

(75) Inventors: Chu-Wei Hu; Jine-Wen Weng; Ruey-Yun Shiue, all of Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/541,480

(22) Filed: Apr. 3, 2000

(51) Int. Cl.[7] ............... H01L 21/3205; H01L 21/4763; H01L 21/44
(52) U.S. Cl. .................. 438/592; 438/664; 438/683
(58) Field of Search ................ 438/305–307, 438/299–303, 592–595, 683, 524, 530, 682–688, 660–664

(56) References Cited

U.S. PATENT DOCUMENTS

| | | | |
|---|---|---|---|
| 5,550,084 A | * 8/1996 | Anjum et al. | 437/200 |
| 5,780,349 A | 7/1998 | Naem | 438/305 |
| 5,801,086 A | 9/1998 | Lee | 438/558 |
| 5,851,912 A | 12/1998 | Liaw et al. | 438/621 |
| 5,899,741 A | 5/1999 | Tseng et al. | 438/649 |
| 5,940,726 A | 8/1999 | Yu | 438/597 |
| 6,004,871 A | * 12/1999 | Kittl et al. | 438/592 |
| 6,096,638 A | * 8/2000 | Matsubara | 438/649 |
| 6,187,679 B1 | * 2/2001 | Cabral, Jr. et al. | 438/682 |

\* cited by examiner

*Primary Examiner*—Caridad Everhart
*Assistant Examiner*—Calvin Lee
(74) *Attorney, Agent, or Firm*—George O. Saile; Stephen B. Ackerman

(57) ABSTRACT

A new method of forming selective salicide is described, whereby low resistance salicide is formed on exposed MOSFET CMOS, narrow polysilicon gates and lightly doped source/drains (LLD) without affecting device electrical performance. This invention describes a selective salicide process forming titanium salicide on exposed MOSFET CMOS devices using ion implantation for effective ion mixing between a two-step titanium deposition process. First, a thin layer of titanium is deposited on exposed polysilicon gate and exposed lightly doped source/drain (LLD) regions. Second, a low energy ion implantation of Si+ is performed with peak dose targeted to be just below the Ti/Si interface. Third, an initial rapid thermal anneal (RTA) is performed followed by a selective etch to remove unwanted, excess titanium. The final step is another rapid thermal anneal (RTA) to fully convert the silicide from C49 crystal structure to the preferred C54 structure, for low resistivity. Hence, low resistivity self-aligned silicide is formed on narrow polygates and lightly doped source/drains (LLD) without affecting device electrical performance.

34 Claims, 3 Drawing Sheets

ION MIXING BETWEEN TWO-STEP TITANIUM DEPOSITION PROCESS FOR TITANIUM SALICIDE CMOS TECHNOLOGY

BACKGROUND OF THE INVENTION

(1) Field of the Invention

This invention relates to a method of fabrication used for semiconductor integrated circuit devices, and more specifically to a method whereby a selective salicide process forms titanium salicide on exposed MOSFET CMOS devices using ion implantation for effective ion mixing between a two-step titanium deposition process.

(2) Description of Related Art

An important challenge in MOSFET CMOS technology is to form low resistance silicides on lightly doped source/drains (LDD), without affecting device electrical performance.

Related Prior Art background patents will now be described in this section.

U.S. Pat. No. 5,940,726 entitled "Method for Forming an Electrical Constant for Embedded Memory" granted Aug. 17, 1999 to Yu describes a method for forming an MOSFET memory device that utilizes a titanium silicide layer in a contact opening. Electrical contact within a deep contact opening is described. A contact opening is etched through a dielectric layer to a semiconductor substrate. Good electrical contact is reported to be made, wherein the contact opening has an aspect ratio greater than one, and wherein, contaminants are found on the surface of the semiconductor substrate, at the bottom of the contact opening. A titanium layer is deposited overlying the dielectric layer and within the contact opening. Silicon ions are implanted into the substrate at a vertical implant wherein the peak implant dose is targeted for the interface between the titanium layer and the semiconductor substrate within the contact opening. Thereafter, the substrate is annealed, whereby the titanium layer is transformed into titanium silicide, and whereby, the contaminants are broken up. Thereafter, a metal layer is deposited within the contact opening, to complete the electrical contact.

U.S. Pat. No. 5,899,741 entitled "Method of Manufacturing Low Resistance and Low Junction Leakage Contact" granted May 4, 1999 to Tseng et al. describes a process wherein an amorphous silicon layer is deposited and ion implanted before a titanium deposition. The method teaches the deposition of an amorphous silicon glue layer in the formation of a contact. An insulating layer is deposited overlying semiconductor device structures. An opening is etched through the insulating layer to contact one of the semiconductor device structures. An amorphous silicon layer is deposited overlying the insulating layer and within the opening. Ions are implanted into the amorphous silicon layer whereby grain sizes within the amorphous silicon layer are reduced. Native oxide on the surface of the amorphous silicon layer is removed. A titanium/titanium nitride layer is deposited overlying the amorphous silicon layer. A metal layer is deposited overlying the titanium/titanium nitride layer and filling the opening. The substrate is annealed, whereby, the titanium layer reacts with the amorphous silicon layer, and the silicon semiconductor substrate, to form titanium silicide. The metal layer is etched back or patterned to complete metallization in the fabrication of an integrated circuit device.

U.S. Pat. No. 5,801,086 entitled "Process for Formation of Contact Conductive Layer in a Semiconductor Device" granted Sep. 1, 1998 to Lee describes a method for forming a contact between a conductive layer and a portion of the substrate during manufacture of a semiconductor device. The process includes the steps of: (a) covering a semiconductor substrate with an insulating layer, and forming a contact hole; (b) forming a metal layer on the whole surface of the substrate, and implanting positive ions into the metal layer; and (c) heat-treating the whole substrate so as to form a silicide layer. The metals used are those which can react with silicon to form a silicide, and can be selected from high melting point metals including: Co, Ti, Ta, Ni, Mo, and Hf. The ions used include H+ or halogen element ions, and a heat treatment is carried out so that the implanted positive ions spread on/in the grain boundaries. Further, silicidation heat treatments are carried out so that the silicide forms on the portion where the metal and the silicon substrate contact together.

U.S. Pat. No. 5,851,912 entitled "Modified Tungsten-Plug Contact Process" granted Dec. 22, 1998 to Liaw et al. teaches a method for the fabrication of an ohmic, low resistance contact to heavily doped silicon, using a chemical vapor deposition (CVD) of a tungsten-plug provided with a Ti/TiN barrier metallurgy. Contact holes are patterned in a borophosphosilicate glass insulator and the exposed silicon substrate contacts are implanted. Instead of activating the implant with a rapid-thermal-anneal (RTA), at this point, the Ti/TiN barrier metallurgy is applied first, then followed by an anneal. By using the Ti/TiN metallurgy to support the glass, higher annealing temperatures are permitted.

U.S. No. 5,780,349 entitled "Self-Aligned MOSFET Gate/Source/Drain Salicide Formation" granted Jul. 14, 1998 to Naem describes the formation of an MOSFET device structure that includes planarized trench isolation field oxide regions in a silicon substrate. A layer of cobalt is deposited on a polysilicon gate and raised source/drain polysilicon regions. The cobalt layer is then implanted with heavy ions to mix the cobalt and silicon at the cobalt/poly interface. A thin titanium nitride film is then formed on the cobalt layer to protect the cobalt film from nitrogen diffusion during rapid thermal annealing (RTA). A second anneal step is then performed to form cobalt salicide on the raised source/drain polysilicon regions and on the polysilicon gate.

SUMMARY OF THE INVENTION

It is a general object of the present invention to provide an improved method of forming an integrated circuit in which a selective salicide process forms titanium salicide on exposed MOSFET CMOS devices, using ion implantation for effective ion mixing between a two-step titanium deposition process.

A high energy process utilizing ion implantation of Si through a Ti layer to the Ti/Si interface with ion mixing is very useful for reducing the sheet resistance of Ti salicide on narrow lines. However, high energy implantation induces many defects, i.e., Si interstitials, which contribute to transient enhanced diffusion (TED) and degradation of device performance. Therefore, in the present invention, the Ti layer thickness is reduced, so that, the implant energy can be reduced, and thus, this present process avoids any negative effects on device performance. Another deposition of Ti is performed, to maintain adequate film thickness and adequate cross-sectional area for low resistance of the salicide.

A more specific object of the present invention is to provide an improved method of forming an integrated circuit in which a salicide layer is formed on sub-0.25 micron, high performance MOSFET CMOS devices with lightly doped drains (LDD) and polysilicon narrow gate stacks. Prior to the special selective titanium deposition process for titanium salicide formation, openings are formed on the top of polysilicon gates and source/drain regions. In subsequent processing steps, titanium salicide is selectively formed on both the N-channel and P-channel FET's, on the exposed silicon SID regions and exposed polysilicon regions.

In accordance with the present invention, the above and other objectives are realized by using a method of fabricating a salicide layer on a semiconductor substrate, wherein, the main embodiments of the present invention are: ion mixing between a two-step Ti deposition process for titanium salicide, $TiSi_2$, formation. More specifically, the first key process step, in the present invention, is the deposition of a thin titanium layer on exposed silicon regions, in contact with exposed polysilicon gates and source/drain regions. The second key process step is an ion implantation of silicon through the titanium layer, peaking the maximum silicon dose at just below the Ti/Si interface. Note, key to this process step is that the ion implantation energy is low.

The third key process step, of the present invention, is the deposition of another thin titanium layer on the first titanium layer. Finally, the fourth set of important process steps in the present invention are: a) a rapid thermal anneal (RTA) in an inert atmosphere is performed to partially diffusion and form silicide with preferred C54 crystal structure, b) next, a selective wet etch is performed to remove unwanted and excess titanium over oxide and passivation regions, c) finally, another rapid thermal anneal (RTA) in an inert atmosphere is performed converting C49 to the preferred C54 crystal structure, low resistivity form. Thus, salicide is formed with low Ra for narrow poly and OD., with reduced silicide leakage. The silicide material is self-aligned to form salicide structures.

Several of the process details are now summarized. The titanium metal layer ranges in total thickness from approximately 150 to 500 Angstroms, with the first layer being about 50 to 200 Angstroms thick and the second layer being about 100 to 250 thick. The titanium is sputter deposited by physical vapor deposition. The ion implantation of Si+ is a low energy implantation from about 10 to 40 KeV, with a dose from about $1 \times 10^{14}$ atoms/cm$^2$ to $5 \times 10^{14}$ atoms/cm$^2$, with peak dose depth from about 60 to 250 Angstroms, which peaks the implantation at just below the metal/Si interface. The rapid thermal anneals (RTA). are performed in an inert atmosphere with the first mentioned rapid thermal anneal being performed in a time at temperature, which ranges from about 10 to 40 minutes at temperatures from about 600 to 800° C., and while the second mentioned rapid thermal anneal (RTA) is performed in a time at temperature, which ranges from about 5 to 30 minutes at temperatures from about 700 to 900° C. The combination of titanium metal layers with the ion implantation of silicon and two rapid thermal annealing steps completely converts the metal to metal silicide, with the preferred C54 crystal structure, on the exposed polysilicon gates and said source/drains, forming self-aligned electrical low resistance lines and contacts. One of the final processing steps is a selective metal wet etch, which removes excess, unwanted and unreacted metal from non-active regions of oxide, isolation and passivation material while not attacking said salicide by a selective wet etch.

In summary, silicide formation occurs by reaction and diffusion of silicon atoms from the ion implanted region and through the polysilicon to the surface. The special Si ion implantation in-between a two-step Ti deposition and two-step rapid thermal anneal (RTA), in an inert atmosphere resulting in ion mixing and converts the silicide from C49 crystal structure to the preferred C54, the low electrical resistance structure. Salicide formation occurs only in the exposed polysilicon areas and at the top of the source/drain areas, hence it is a self-aligned process. Deleterious bridging, which is silicide formation between the polysilicon and closely spaced source/drain regions is minimized by this.

The present process reduces lateral silicide growth, hence minimizing the electrical leakage problems. The insulating sidewall spacers and oxide shallow trench isolation (STI), that see exposure to the selective salicide processing metal, do not react to form silicide. Also, the present process lowers the series resistance of narrow polysilicon, with small statistical deviation, in sub-0.25 micron high performance MOSFET CMOS devices.

This invention has been summarized above and described with reference to the preferred embodiments. Some processing details have been omitted and are understood by those skilled in the art. More details of this invention are stated in the "DESCRIPTION OF THE PREFERRED EMBODIMENTS", the specification section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

A high energy process utilizing ion implant of Si through a Ti layer to the Ti/Si interface with ion mixing is very useful for reducing the sheet resistance of Ti salicide on narrow lines. However, high energy implantation induces many defects, i.e., Si interstials, which contribute to transient enhanced diffusion (TED) and degradation of device performance. Therefore, in the present invention, the Ti layer thickness is reduced, so that, the implant energy can be reduced, and thus, this present process avoids any negative effects on device performance. Another deposition of Ti is performed, to maintain adequate film thickness and adequate cross-sectional area for low resistance of the salicide.

Figure 1:
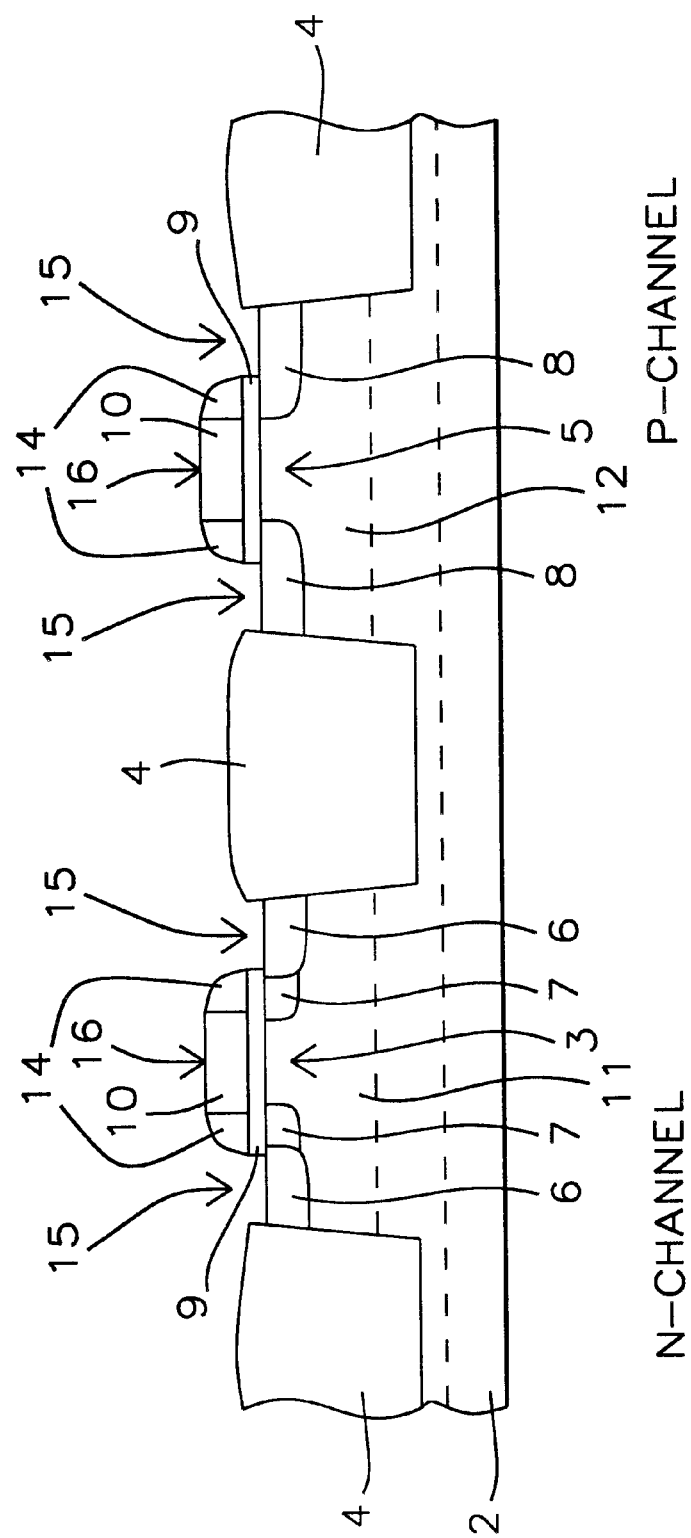
FIG. 1, which in cross-sectional representation illustrate the method of one embodiment of the present invention, wherein sub-0.25 micron high performance MOSFET CMOS devices are shown, just prior to the special titanium deposition process for titanium salicide formation.

Referring to FIG. 1, which in cross-sectional representation illustrate the method of one embodiment of the present invention, wherein sub-0.25 micron high performance MOSFET CMOS devices are shown, just prior to the special titanium deposition process for titanium salicide formation. FIG. 1 sketches an outline of two MOSFET CMOS device structures, the one on the left-hand side represents an N-channel FET (3), while the one on the right-hand side represents a P-channel FET (5). The substrate (2) is a semiconductor substrate with N-channel implanted source and drain with lightly doped (LDD) regions (7) and with N+ S/D regions (6). The lightly doped (LDD) P-channel source drain regions and P+ S/D regions (8) are sketched together. An ion implanted P-well (11) is sketched with a dotted line with the associated N-channel device on the left of FIG. 1, and an ion implanted N-well (12) is sketched with dotted line with the associated P-channel device on the right of FIG. 1. Shallow trench isolation (STI) with thick field oxide (4) electrically isolates the FET'S. Polysilicon gate structures (10) with gate oxide (9) and a thin polysilicon oxide layer on the sidewalls of poly gates (too thin to be sketched in Figs.) are illustrated. Tetraethylorthosilicate, TEOS, sidewall spacers (14) are also depicted in FIG. 1. The regions where, in subsequent processing, titanium salicide is selectively formed on both the N-channel and P-channel FET's occurs on the exposed silicon S/D regions (15) and exposed polysilicon regions (16).

Referring to FIGS. 2A–2D, which in cross-sectional representation sketch the key components in the main embodiments of the present invention, the ion mixing between two-step Ti deposition process for titanium salicide, $TiSi_2$, formation. More specifically with reference to FIG. 2A, which in cross-sectional representation, illustrates the first key process step in the present invention. A thin titanium layer (20) is deposited on the exposed silicon regions (22), specifically in contact with exposed polysilicon gate and source/drain regions.

Figure 2A:
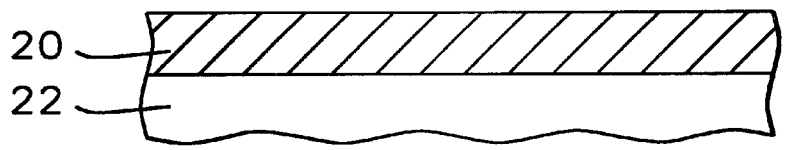
FIGS. 2A–2D, which in cross-sectional representation illustrate the method of the main embodiments of the present invention, the ion mixing between two-step Ti deposition process for titanium salicide, $TiSi_2$, formation.
Figure 2B:
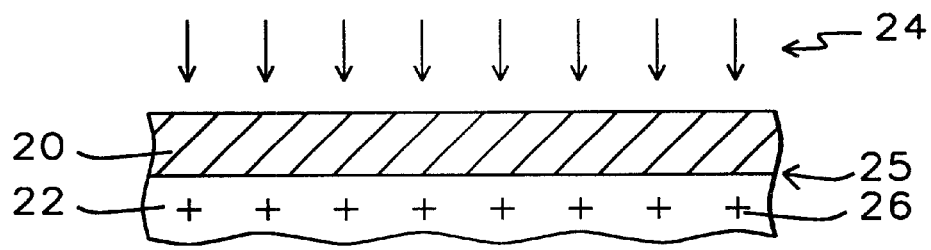

Referring to FIG. 2B, which in cross-sectional representation illustrates the second key process step in the present invention, the ion implantation (24) of silicon through the titanium layer (20) and peaking the maximum silicon dose (26) at just below the Ti/Si interface (25). Note, key to this process step is that the ion implantation energy is low.

Figure 2C:
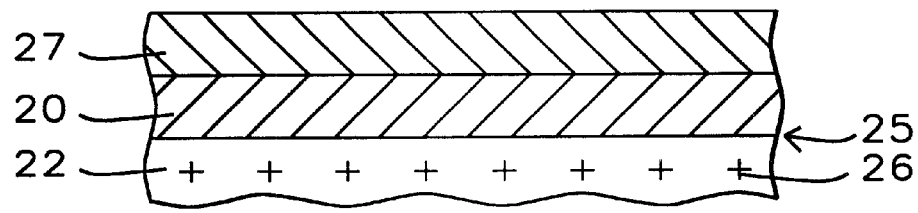

Referring to FIG. 2C, which in cross-sectional representation illustrates the third key process step of the present invention. Another thin titanium layer (27) is deposited on the first titanium layer (20).

Figure 2D:
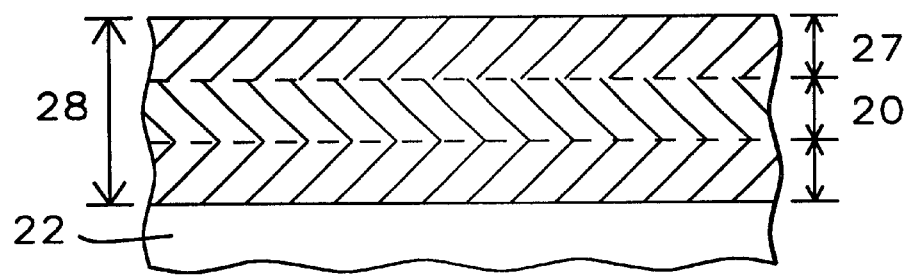

Referring to FIG. 2D, which in cross-sectional representation illustrates a final set of key process steps in the present invention. First, a rapid thermal anneal (RTA) in an inert atmosphere is performed. Next, a selective wet etch is performed to remove unwanted and excess titanium over oxide and passivation regions. This selective etch reduces electrical leakage problems. Finally, another rapid thermal anneal (RTA) in an inert atmosphere is performed. The end result is that a homogeneous titanium silicide (28), approximately from 150 to 500 Angstroms is formed, converting C49 to the preferred C54 crystal structure (low resistivity form). Hence, the process forms low sheet resistance, $R_s$, for narrow poly and OD., with reduced silicide leakage. The silicide material is self-aligned to form salicide structures.

Several of the process details are outlined below for completeness. The titanium metal layer ranges in total thickness from approximately 150 to 500 Angstroms, with the first layer being about 50 to 200 Angstroms thick and the second layer being about 100 to 250 thick. The titanium is sputter deposited by physical vapor deposition. The ion implantation of Si+ is a low energy implantation from about 10 to 40 KeV, with a dose from about $1 \times 10^{14}$ atoms/cm$^2$ to $5 \times 10^{14}$ atoms/cm$^2$, with peak dose depth from about 60 to 250 Angstroms, which peaks the implantation at just below the metal/Si interface. The rapid thermal anneals (RTA) are performed in an inert atmosphere with the first mentioned rapid thermal anneal being performed in a time at temperature, which ranges from about 10 to 40 minutes at temperatures from about 600 to 800° C., and while the second mentioned rapid thermal anneal (RTA) is performed in a time at temperature, which ranges from about 5 to 30 minutes at temperatures from about 700 to 900° C. The combination of titanium metal layers with the ion implantation of silicon and two rapid thermal annealing steps completely converts the metal to metal silicide, with the preferred C54 crystal structure, on the exposed polysilicon gates and said source/drains, forming self-aligned electrical low resistance lines and contacts. One of the final processing steps is a selective metal wet etch, which removes excess, unwanted and unreacted metal from non-active regions of oxide, isolation and passivation material while not attacking said salicide by a selective wet etch.

Figure 3:
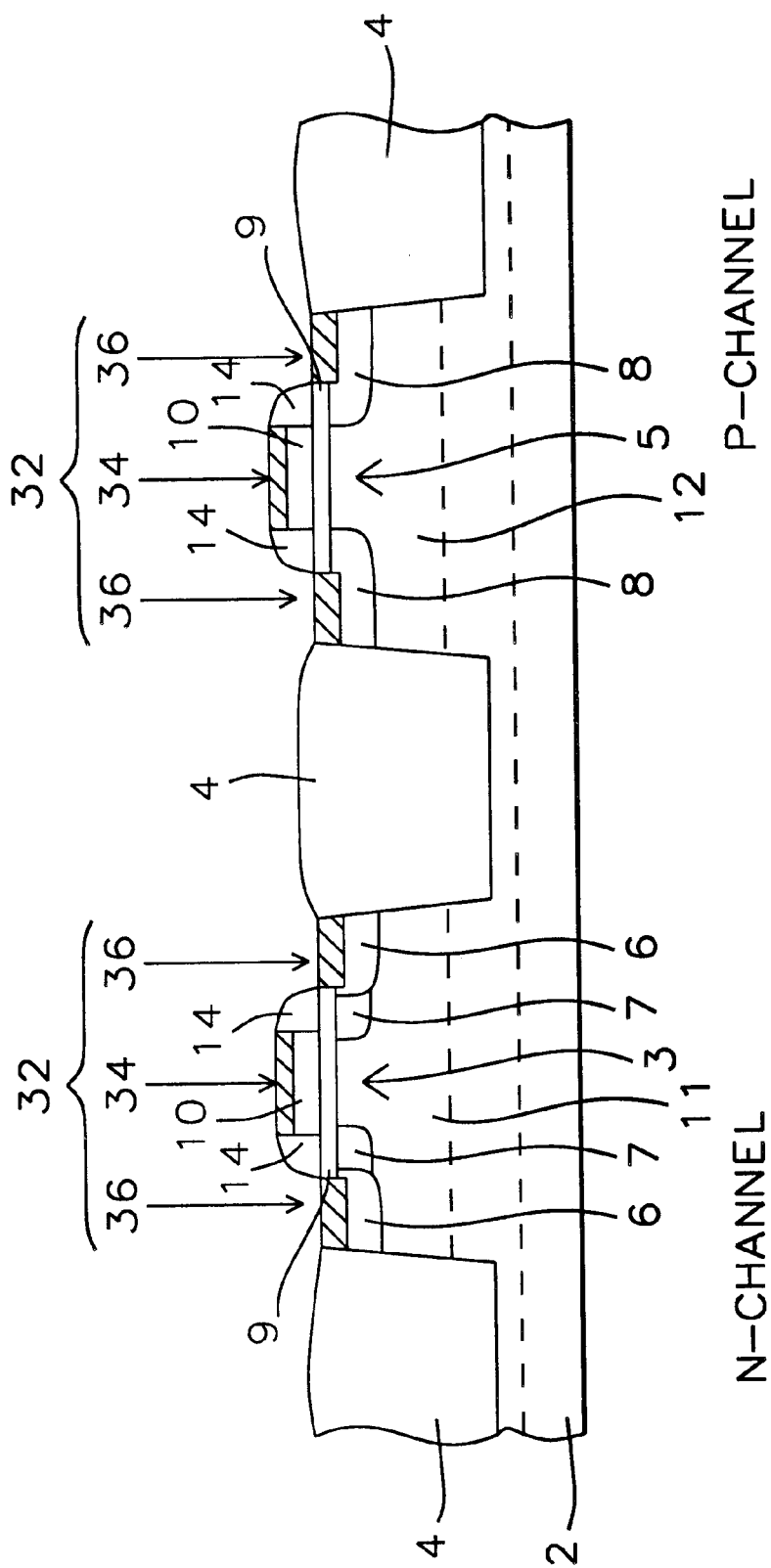
FIG. 3, which in cross-sectional representation illustrate the method of another embodiment of the present invention, wherein sub-0.25 micron high performance MOSFET CMOS devices are shown, just after the special process for titanium salicide, $TiSi_2$, formation.

Referring to FIG. 3, which in cross-sectional representation illustrate the final result of the embodiments of the present invention, wherein sub-0.25 micron high performance MOSFET CMOS devices are shown, just after the special process for titanium salicide formation. FIG. 3 sketches an outline of two MOSFET CMOS device structures, the one on the left-hand side represents an N-channel FET (3), while the one on the right-hand side represents a P-channel FET (5). Selective salicide formation (32) is shown on all the exposed silicon surfaces, that is, at the top of the polysilicon gates (34) and in the diffusion regions (36). The insulating sidewall spacers (14) and oxide shallow trench isolation (4), that see exposure to the selective salicide processing metal, do not react to form silicide. The present process reduces lateral silicide growth, hence minimizing the electrical leakage problems. Also, the present process lowers the sheet resistance of narrow polysilicon, with small statistical deviation.

While the invention has been particularly shown and described with reference to the preferred embodiments thereof, it will be understood by those skilled in the art that various changes in form and details may be made without departing from the spirit and scope of the invention.

What is claimed is:

1. A method of forming salicide electrical lines and contacts in the fabrication of an integrated circuit comprising:

providing a semiconductor silicon substrate having polysilicon gates and source/drains therein;

exposing said polysilicon gates and said source/drains whereby the silicon is exposed;

depositing a thin layer of metal on exposed said polysilicon gates and said source/drains;

implanting by ion implantation Si+ at low energy through said metal layer, peaking the maximum Si+ dose to just below the metal/Si interface;

depositing another thin layer of said metal on said polysilicon gates and said source/drains;

annealing said substrate by rapid thermal annealing in an inert atmosphere forming a metal silicide on said polysilicon gates and said source/drains;

etching by selective etching the excess and unreacted said metal deposited above;

annealing said substrate again by rapid thermal annealing whereby said metal is further salicidated converting completely to a metal silicide on said polysilicon gates and said source/drains, forming self-aligned low resistance lines and contacts.

2. The method of claim 1, wherein said substrate is semiconductor single crystal silicon or an IC module.

3. The method of claim 1, wherein said substrate is embedded CMOS devices therein with both N-Channel and P-Channel MOSFET devices.

4. The method of claim 1, wherein said metal is titanium ranging in total thickness from approximately 150 to 500 Angstroms, with the first layer being about 50 to 200 Angstroms thick and the second layer being about 100 to 250 thick, sputter deposited by physical vapor deposition.

5. The method of claim 1, wherein said metal salicide process is made with titanium metal.

6. The method of claim 1, wherein said low energy Si+ implant is from about 10 to 40 KeV, with a dose from about $1 \times 10^{14}$ atoms/cm$^2$ to $5 \times 10^{14}$ atoms/cm$^2$, with peak dose depth from about 60 to 250 Angstroms peaking the implantation at just below the metal/Si interface.

7. The method of claim 1, wherein said rapid thermal annealing are performed in an inert atmosphere with the first mentioned rapid thermal annealing being performed in a time at temperature, which ranges from about 10 to 40 minutes at temperatures from about 600 to 800° C., and for the second mentioned rapid thermal annealing being performed in a time at temperature, which ranges from about 5 to 30 minutes at temperatures from about 700 to 900° C.

8. The method of claim 1, wherein the combination of said metal layers with ion implantation of silicon and two rapid thermal anneals completely converts the said metal to metal silicide, with the preferred C54 crystal structure, on said polysilicon gates and said source/drains, forming self-aligned electrical low resistance lines and contacts.

9. The method of claim 1, wherein said selective metal etch, removes excess, unwanted and unreacted metal from non-active regions of oxide, isolation and passivation material while not attacking said salicide by a selective wet etch.

10. A method of forming salicide electrical lines and contacts in the fabrication of quarter micron and circuit comprising:
    providing a semiconductor silicon substrate having polysilicon gates and source/drains therein;
    exposing on said polysilicon gates and said source/drains whereby the silicon is exposed;
    depositing a thin layer of titanium metal on exposed said polysilicon gates and said source/drains;
    implanting by ion implantation Si+ at low energy through said metal layer, peaking the maximum Si+ dose to just below the titanium metal/Si interface;
    depositing another thin layer of said titanium metal on said polysilicon gates and said source/drains;
    annealing said substrate by rapid thermal annealing in an inert atmosphere forming a titanium metal silicide on exposed said polysilicon gates and said source/drains;
    etching by selective etching the excess and unreacted said titanium metal deposited above;
    annealing said substrate again by rapid thermal annealing in an inert atmosphere whereby said titanium metal is further salicidated converting completely to a titanium metal silicide, the preferred C54 crystal structure, on said polysilicon gates and said source/drains, forming self-aligned electrical low resistance lines and contacts.

11. The method of claim 10, wherein said substrate is semiconductor single crystal silicon or an IC module.

12. The method of claim 10, wherein said substrate is embedded CMOS devices therein with both N-Channel and P-Channel MOSFET devices.

13. The method of claim 10, wherein said metal is titanium ranging in total thickness from approximately 150 to 500 Angstroms, with the first layer being about 50 to 200 Angstroms thick and the second layer being about 100 to 250 thick, sputter deposited by physical vapor deposition.

14. The method of claim 10, wherein said metal salicide process is made with titanium metal.

15. The method of claim 10, wherein said low energy Si+ implant is from about 10 to 40 KeV, with a dose from about $1 \times 10^{14}$ atoms/cm$^2$ to $5 \times 10^{14}$ atoms/cm$^2$, with peak dose depth from about 60 to 250 Angstroms peaking the implantation at just below the metal/Si interface.

16. The method of claim 10, wherein said rapid thermal annealing are performed in an inert atmosphere with the first mentioned rapid thermal annealing being performed in a time at temperature, which ranges from about 10 to 40 minutes at temperatures from about 600 to 800° C., and for the second mentioned rapid thermal annealing being performed in a time at temperature, which ranges from about 5 to 30 minutes at temperatures from about 700 to 900° C.

17. The method of claim 10., wherein the combination of said metal layers with ion implantation of silicon and two rapid thermal anneals completely converts the said metal to metal silicide, with the preferred C54 crystal structure, on said polysilicon gates and said source/drains, forming self-aligned electrical low resistance lines and contacts.

18. The method of claim 10, wherein said selective metal etch, removes excess, unwanted and unreacted metal from non-active regions of oxide, isolation and passivation material while not attacking said salicide by a selective wet etch.

19. A method of forming salicide electrical lines and contacts in the fabrication of quarter micron and below MOSFET N-Channel devices with narrow polysilicon gates and lightly doped source/drains in an intergrated circuit comprising:
    providing a semiconductor silicon substrate having polysilicon gates and source/drains therein;
    forming openings on said polysilicon gates and said source/drains whereby the silicon is exposed;
    depositing a thin layer of titanium metal on exposed said polysilicon gates and said source/drains;
    implanting by ion implantation Si+ at low energy through said metal layer, peaking the maximum Si+ dose to just below the titanium metal/Si interface;
    depositing another thin layer of said titanium metal on said polysilicon gates and said source/drains;
    annealing said substrate by rapid thermal annealing in an inert atmosphere forming a titanium metal silicide on exposed said polysilicon gates and said source/drains;
    etching by selective etching the excess and unreacted said titanium metal deposited above;
    annealing said substrate again by rapid thermal annealing in an inert atmosphere whereby said titanium metal is further salicidated converting completely to a titanium metal silicide, the preferred C54 crystal structure, on said polysilicon gates and said source/drains, forming self-aligned electrical low resistance lines and contacts for MOSFET N-Channel devices.

20. The method of claim 19, wherein said substrate is semiconductor single crystal silicon or an IC module.

21. The method of claim 19, wherein said metal is titanium ranging in total thickness from approximately 150 to 500 Angstroms, with the first layer being about 50 to 200 Angstroms thick and the second layer being about 100 to 250 thick, sputter deposited by physical vapor deposition.

22. The method of claim 19, wherein said metal salicide process is made with titanium metal.

23. The method of claim 19, wherein said low energy Si+ implant is from about 10+ to 40 KeV, with a dose from about $1 \times 10^{14}$ atoms/cm$^2$ to $5 \times 10^{14}$ atoms/cm$^2$, with peak dose depth from about 60 to 250 Angstroms peaking the implantation at just below the metal/Si interface.

24. The method of claim 19, wherein said rapid thermal annealing are performed in an inert atmosphere with the first mentioned rapid thermal annealing being performed in a time at temperature, which ranges from about 10 to 40 minutes at temperatures from about 600 to 800° C., and for the second mentioned rapid thermal annealing being performed in a time at temperature, which ranges from about 5 to 30 minutes at temperatures from about 700 to 900° C.

25. The method of claim 19, wherein the combination of said metal layers with ion implantation of silicon and two rapid thermal anneals completely converts the said metal to metal silicide, with the preferred C54 crystal structure, on said polysilicon gates and said source/drains, forming self-aligned electrical low resistance lines and contacts.

26. The method of claim 19, wherein said selective metal etch, removes excess, unwanted and unreacted metal from non-active regions of oxide, isolation and passivation material while not attacking said salicide by a selective wet etch.

27. A method of forming salicide electrical lines and contacts in the fabrication of quarter micron and below MOSFET P-Channel devices with narrow polysilicon gates and lightly doped source/drains in an integrated circuit comprising:

providing a semiconductor silicon substrate having polysilicon gates and source/drains therein;

exposing said polysilicon gates and said source/drains whereby the silicon is exposed;

depositing a thin layer of titanium metal on exposed said polysilicon gates and said source/drains;

implanting by ion implantation Si+ at low energy through said metal layer, peaking the maximum Si+ dose to just below the titanium metal/Si interface;

depositing another thin layer of said titanium metal on said polysilicon gates and said source/drains;

annealing said substrate by rapid thermal annealing in an inert atmosphere forming a titanium metal silicide on exposed said polysilicon gates and said source/drains;

etching by selective etching the excess and unreacted said titanium metal deposited above;

annealing said substrate again by rapid thermal annealing in an inert atmosphere whereby said titanium metal is further salicidated converting completely to a titanium metal silicide, the preferred C54 crystal structure, on said polysilicon gates and said source/drains, forming self aligned electrical low resistance lines and contacts for MOSFET N-Channel devices.

28. The method of claim 27, wherein said substrate is semiconductor single crystal silicon or an IC module.

29. The method of claim 27, wherein said metal is titanium ranging in total thickness from approximately 150 to 500 Angstroms, with the first layer being about 50 to 200 Angstroms thick and the second layer being about 100 to 250 thick, sputter deposited by physical vapor deposition.

30. The method of claim 27, wherein said metal salicide process is made with titanium metal.

31. The method of claim 27, wherein said low energy Si× implant is from about 10 to 40 KeV, with a dose from about $1\times10^{14}$ atoms/cm$^2$ to $5\times10^{14}$ atoms/cm$^2$, with peak dose depth from about 60 to 250 Angstroms peaking the implantation at just below the metal/Si interface.

32. The method of claim 27, wherein said rapid thermal annealing are performed in an inert atmosphere with the first mentioned rapid thermal annealing being performed in a time at temperature, which ranges from about 10 to 40 minutes at temperatures from about 600 to 800° C., and for the second mentioned rapid thermal annealing being performed in a time at temperature, which ranges from about 5 to 30 minutes at temperatures from about 700 to 900° C.

33. The method of claim 27, wherein the combination of said metal layers with ion implantation of silicon and two rapid thermal anneals completely converts the said metal to metal silicide, with the preferred C54 crystal structure, on said polysilicon gates and said source/drains, forming self-aligned electrical low resistance lines and contacts.

34. The method of claim 27, wherein said selective metal etch, removes excess, unwanted and unreacted metal from non-active regions of oxide, isolation and passivation material while not attacking said salicide by a selective wet etch.

* * * * *